United States Patent [19]

Perryman

[11] 4,439,216
[45] Mar. 27, 1984

[54] ELECTROSTATIC PRECIPITATOR HAVING APPARATUS FOR SENSING ELECTROSTATIC FIELD STRENGTHS

[75] Inventor: John W. Perryman, Chelsea, Ala.

[73] Assignee: Combustion Engineering, Inc., Windsor, Conn.

[21] Appl. No.: 402,504

[22] Filed: Jul. 28, 1982

[51] Int. Cl.³ .............................................. B03C 3/08
[52] U.S. Cl. ....................................... 55/104; 55/274; 323/903
[58] Field of Search ................. 55/104, 105, 149, 270, 55/274; 361/235; 323/903; 340/661

[56] References Cited

U.S. PATENT DOCUMENTS

| | | | |
|---|---|---|---|
| 2,943,697 | 7/1960 | Little | 55/105 |
| 3,362,134 | 1/1968 | Wiemer | 55/104 |
| 3,488,675 | 1/1970 | Eishold | 55/105 |
| 3,643,405 | 2/1972 | Vukasovic et al. | 55/105 |
| 3,938,059 | 2/1976 | Canning | 323/903 |
| 3,977,848 | 8/1976 | Oliphant | 55/149 |
| 4,318,152 | 3/1982 | Weber | 55/104 |
| 4,366,433 | 12/1982 | Imazeki et al. | 340/661 |

FOREIGN PATENT DOCUMENTS

| | | | |
|---|---|---|---|
| 45-21879 | 7/1970 | Japan | 55/104 |
| 52-55065 | 5/1977 | Japan | 55/149 |
| 611677 | 6/1978 | U.S.S.R. | 55/4 |

Primary Examiner—David L. Lacey
Attorney, Agent, or Firm—William W. Habelt

[57] ABSTRACT

An electrostatic precipitator (10) of the type having a casing (12) defining a precipitation chamber (6) wherein a plurality of discharge electrode frames (32) are disposed alternately between a plurality of collecting electrode plates (20). Paired probe devices (50) are mounted on the collecting electrode plates for sensing the strength of the electrostatic field generated by at least one discharge electrode wire (36) at at least one location on each of the collecting electrode plates (20) disposed adjacent thereto. The electrostatic field strength sensed by the paired probe devices are compared with each other to provide an indication of the degree of imbalance, if any, existing between the sensed electrostatic fields experienced by the bounding electrode plates. The existence of an imbalance and the strength of the electrostatic fields on the bounding collecting electrode plates and the degree of any such imbalance provide an indication of whether or not the discharge electrode frame is properly positioned within the assembly of collecting electrode plates.

4 Claims, 3 Drawing Figures

ELECTROSTATIC PRECIPITATOR HAVING APPARATUS FOR SENSING ELECTROSTATIC FIELD STRENGTHS

BACKGROUND OF THE INVENTION

The present invention relates to electrostatic precipitators and, more particularly, to an improved electrostatic precipitator incorporating means for properly positioning the collection electrodes with respect to the discharge electrodes so as to optimally align the electrostatic fields produced within the precipitator.

In the operation of an electrostatic precipitator, a gas laden with entrained particulate material is passed through an electrostatic field established about a discharge electrode disposed between two grounded collector electrodes. The suspended particles become electrically charged as they pass through the electrostatic field and move, under the influence of the electrostatic field, to and deposit upon the grounded collection electrodes flanking the discharge electrode.

Typically, each collecting electrode is formed of one or more elongated plates disposed in a row side by side and suspended from the top of the precipitator housing in a vertical plane. A plurality of such collecting electrodes are disposed transversely across the precipitator casing in spaced vertical planes parallel to the direction of gas flow through the precipitator. A framework of discharge wires is suspended from insulators at the top of the precipitator housing to provide a row of vertical disposed discharge electrode wires between adjacent collecting electrodes across the width of the precipitator.

The positioning of the discharge electrode wires with respect to their adjacent collecting electrode plates is critical. The discharge electrode wire must be exactly equally distant between the collecting electrode plates flanking it in order for the precipitator to operate at maximum efficiency. If any of the discharge electrode wires is closer to one of the collecting electrode plates flanking it than the other, a situation will be presented where there will be a shunning, i.e., a flashover, of voltage between the discharge electrode and the closer of the collecting electrode plates at a voltage lower than the peak operating voltage of the precipitator. Such an occurrence will limit the strength of the field attainable and also lower the operating efficiency of the precipitator.

In the prior art it has been customary to mechanically align the electrostatic fields of the precipitator when the precipitator is out of operation, i.e., in the cold condition. The fields where aligned by visually positioning the discharge electrodes with respect to the collecting electrodes so that the discharge electrodes would be equally distance between the collecting electrode plates. However, some areas of the precipitator were generally inaccessible and proper alignment of these areas could not be assured by the visual method. Additionally, as the discharge electrode wires are supported on a framework suspended on insulators from the top of the precipitator casing, the discharge electrodes are freely moveable at the bottom and under the influence of temperature and gas flow may move out of position during operation. Therefore, properly aligning the discharge electrodes and the collecting electrode plates in the cold condition does not insure that the electrostatic fields will be properly aligned when the precipitator is operating at its normal operating temperature, i.e., the gas temperature, which is typically in the range of 300° to 400° C.

Therefore, it is an object of the present invention to provide an improved electrostatic precipitator wherein alignment of the electrostatic fields is insured at operating temperature.

It is a further object of the present invention to provide means for monitoring the position of the discharge electrode assembly with respect to the collecting plates at operating temperature so as to insure proper alignment of the electrostatic fields.

SUMMARY OF THE INVENTION

The present invention provides an improved electrostatic precipitator of the type having a casing defining a precipitation chamber wherein a plurality of discharge electrode frames are disposed alternately between a plurality of collecting electrode plates. The gas to be cleaned flows through the precipitation chamber passing over the discharge electrode frames and collecting electrode plates. A voltage is applied to the discharge electrode frame upon which a plurality of vertical discharge electrode wires are disposed at spaced intervals. An electrostatic field is generated about the discharge electrode wire under the influence of which the particulate matter in the gas migrates to and collects upon the collecting electrode plates.

In accordance with the invention, the improvement comprises paired probe means operatively associated with the collecting electrode plates for sensing the strength of the electrostatic field generated by at least one discharge electrode wire at at least one location on each of the collecting electrode plates disposed adjacent thereto, and comparison means operatively associated with the paired probe means for comparing the electrostatic field strengths sensed by the paired probe means and for providing an indication of the degree of imbalance, if any, between the sensed electrostatic fields thereby providing an indication of whether or not the discharge electrode frame is properly positioned within the collecting electrode plates.

BRIEF DESCRIPTION OF THE DRAWINGS

The present invention will be better understood and the above and other objects of the present invention will become more apparent and appreciated when viewed in light of the following description of a preferred embodiment with reference to the accompanying drawing wherein.

DESCRIPTION OF A PREFERRED EMBODIMENT

Figure 1:
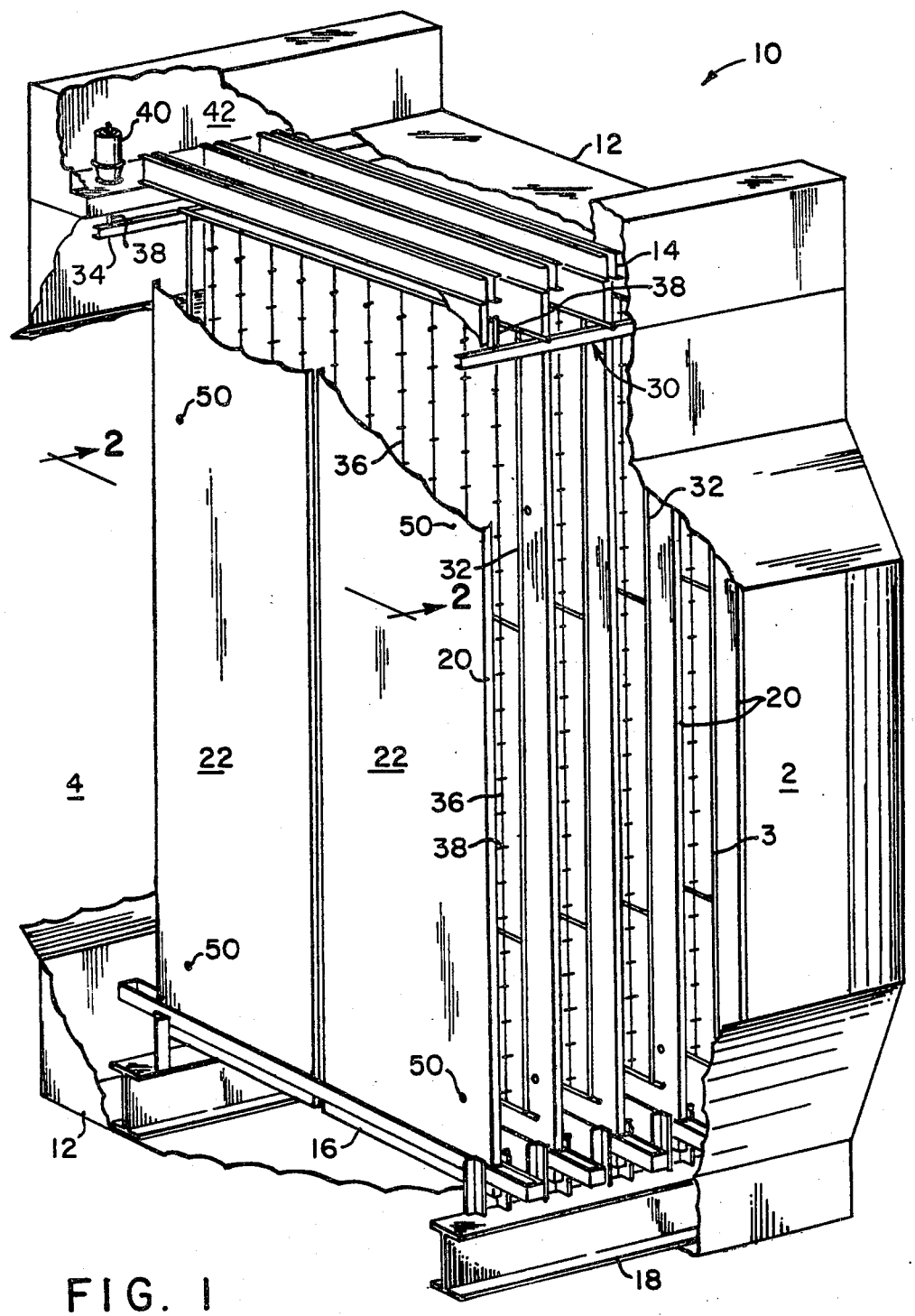
FIG. 1 is a perspective view, partly in section of an improved electrostatic precipitator designed in accordance with the present invention.

Referring now to the drawing, there is depicted therein an electrostatic precipitator 10 having a casing 12 defining an inlet 2, an outlet 4 and a precipitation chamber 6 disposed therebetween. The particulate flue gas to be cleaned passes horizontally through the casing 12 of the precipitator 10 passing from the gas inlet 2 through the precipitation chamber 6 and out the gas outlet 4 as a clean, relatively particulate free gas.

The base configuration of the precipitator 10 shown in the drawing is well known in the prior art. A plurality of substantially rectangular collecting electrode plates 20 are disposed in substantially parallel, spaced relationship in vertical planes within the precipitation chamber 6. Interdisposed in the spaces between the collecting electrode plates 20 are a plurality of discharge electrode frames 32. Both the collection plates 20 and the discharge electrode frame 32 are aligned parallel to and extend in the direction of gas flow through the precipitation chamber 6 from the inlet 2 to the outlet 4 thereof.

Each collecting electrode 20 is formed of one or more collecting electrode plates 22 suspended and supported from upper support beams 14 disposed across the top of the precipitation chamber 6. The lower end of each of the suspended collecting electrode plates 22 is laterally constrained from movement by inserting it into a guide member 16 which is mounted to the lower support beams 18 disposed in the bottom of the precipitation chamber 6. Thus, the suspended electrode plates 22, which may range anywhere from 12 to 50 feet in height, are free to move vertically downward within guide member 16 due to temperature effects but are constrained from any lateral movement by guide members 16.

Electrode plates 22 are shown in the drawing as being of a particular cross section merely for purposes of illustration and not limitation. It is to be understood that the present invention contemplates utilizing collecting electrode plates of any of a number of cross-sectional designs with the particular design utilized in any given situation being selected on an individual basis to give optimal precipitation efficiency and a quiescent zone at the surface of the collecting electrode plates 22.

The individual discharge electrode frames 32 collectively and in conjunction with support bar 34 from which the individual discharge electrode frames 32 are supported and suspended from a box-like discharge electrode frame assembly 30. Each of the individual discharge electrode frames 32 is formed of a plurality of tubular members welded together to form a preferably rectangular frame having intermediate cross members so as to divide the discharge electrode frame into upper, middle and lower sections. This arrangement provides for a strong, rigid support frame which is suspended from and supported by support beams 34 at the top of the precipitation chamber 6.

Mounted within each section of the discharge electrode frames 32 are a plurality of vertically strung discharge electrodes 36 disposed at equally spaced intervals along the direction of gas flow so as to provide uniform distribution of an electrostatic field along the length of the precipitation chamber 6. Although any of a number of discharge electrode designs may be utilized, the typical electrode comprises a flat, thin strip-like or wire-like element having a plurality of corona discharge points 38 disposed at equally spaced intervals along its length.

The box-like discharge electrode frame assembly 30 is suspended at the top four corners thereof by means of link rods 38 which interconnect support beams 34 with support insulators 40. Support insulators 40 are disposed in an insulator compartment 42 running transversely across the top of the precipitation chamber 6 along the inlet and outlet ends of the precipitator casing 12. Link rods 38 are rigidly mounted at their lower ends to support beams 34 and are secured by means of bolts at their upper end to the top support insulators 40. The upper end of the link rod 38 is threaded and attached to the support insulator 40 by means of support nuts which may be adjusted by rotating so as to thread the link rods 38 upwardly or downwardly thereby adjusting the position of the box-like discharge electrode frame assembly 30 relative to the collecting electrodes 20. The support insulator 40 also serves to electrically isolate the discharge electrode frame assembly 30 from the precipitator casing 12.

In operation, a particulate laden gas enters the precipitator casing 12 through the inlet 2 thereof and flows horizontally through the precipitation chamber 6 to the gas outlet 4. In traversing the precipitation chamber 6, the particulate laden gas flows between the spaced collecting electrodes 20 and pass the discharge electrodes 36 disposed therebetween. Due to the action of the corona formed about the corona discharge points 38 on the discharge electrodes 36 and the electrostatic field extending between the discharge electrodes and the collecting plates, the particulates within the gas are ionized and migrate to and deposit upon the collecting electrode plates 22.

As mentioned previously, it is critical that the discharge electrode wires 36 be equally spaced between the bounding collecting electrode plates 22 in order to achieve maximum electrostatic field strength, and therefore precipitation efficiency, without the occurrence of sparkover between the discharge electrodes and the neighboring collecting electrode plates. In accordance with the present invention therefore, there is provided probe means operatively associated with a set of collecting electrode plates for sensing the strength of the electric field generated by the discharge electrodes disposed therebetween and experienced by each of the collecting electrodes bounding the discharge electrode, and means responsive to said probe means for comparing the sense electric field strengths experienced by the two bounding collecting electrode plates and for providing an indication of the degree of imbalance between the sense electrostatic field strengths.

Once the operator of the precipitator is aware that an imbalance exists between the electrostatic fields experienced by the collecting electrodes bounding a discharge electrode, the position of the discharge electrode assembly with respect to the collecting electrode plates may be altered by adjusting the length of one or more of the link rods 38 from which the discharge electrode assembly 30 is suspended. The operator would adjust the position of the discharge electrode assembly 30 to bring the sensed electrostatic field strengths back into balance thereby assuring that the discharge electrode is equally spaced between the bounding collecting electrodes.

To monitor the strength of the electrostatic field of a particular discharge electrode wire 36, a pair of probe means 50 for sensing electrostatic field strength is mounted, one each, in the bounding collecting electrode plate 22 between which the discharge wire being monitored is disposed. The faces of probe means 50 are set directly laterally opposite the discharge wire and in alignment with each other. Wire means for conducting a signal generated by each probe means 50 is routed through a flexible metal conduit 70 through the precipitator casing 12 to the means 60 for comparing the signals from the pair of probe means 50 to each other.

If the signals from the paired probe means 50 are equal, the comparison means 60 will indicate that the electrostatic fields experienced by the bounding collecting electrodes are balanced thereby confirming that the discharge electrode is properly positioned, that is, equally spaced between, the bounding collecting electrode plates.

If the signals from the paired probe means 50 are not equal, the comparison means 60 will indicate that there is an imbalance existing in the electrostatic fields experienced by the bounding collecting electrodes thereby confirming that the discharge electrode is closer to one of the bounding collecting electrodes than it is to the other. Knowing this, the operator can take remedial measures as previously to adjust the positioning of the discharge electrode frame 30 so as to bring the signals into balance and the electrostatic fields into equality.

Although it might be possible after some experimentation and calibration to monitor a single location on a single discharge wire of a precipitator cell as a means of checking for proper alignment of the discharge electrode frame 30 with the assembly of collecting electrodes 22 making up the precipitator, the use of a plurality of probe locations is preferred. However, it is not believed necessary to monitor a number of locations on each discharge electrode wire 36 to ensure optimal alignment of the discharge electrode assembly 30.

Figure 2:
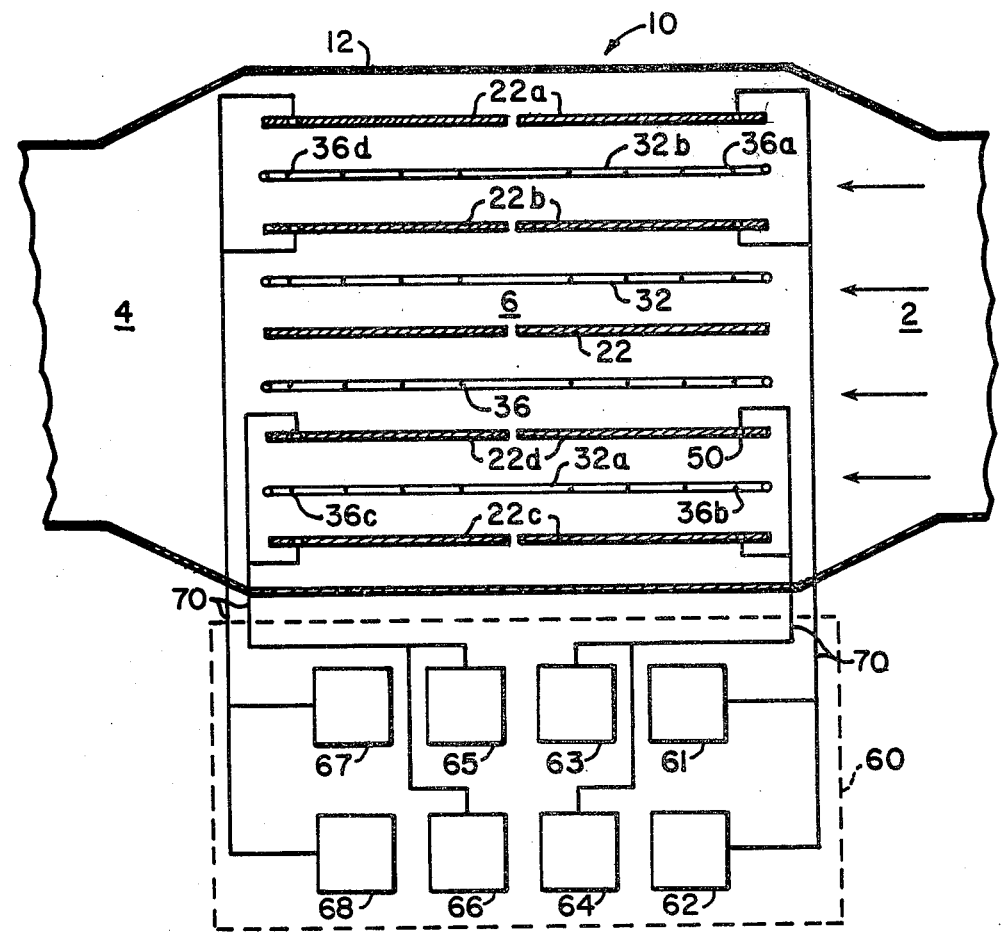
FIG. 2 is a cross-sectional plan view taken in part along line 2—2 of FIG. 1 showing the means for monitoring the positioning of the electrode plates.
Figure 3:
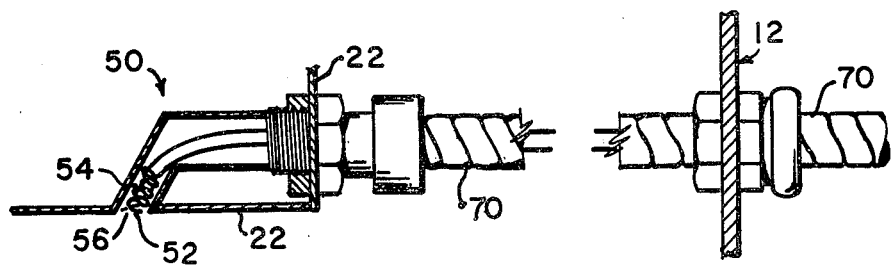
FIG. 3 is an elevational view, partly in section, showing a probe means for monitoring the strength of an electrostatic field.

In the best mode presently contemplated for carrying out the present invention, as best shown in FIGS. 1 and 2, a plurality of paired probes 50, such as shown in FIG. 3, are utilized to monitor the alignment of the discharge electrode assembly 30. Preferably, eight sets of paird probe means 50 are disposed in the collecting electrode plates 22a, 22b, 22c and 22d disposed at the lateral edges of the precipitation chamber 6 to monitor the upstream wires 36a and 36b and the downstream wires 36c and 36d of the lateral most discharge electrodes 32a and 32b at a location preferably in a common horizontal plane, near the top of the discharge electrode frame assembly 30 and also at a location, preferably in a common horizontal plane, near the bottom of the discharge electrode frame assembly 30.

Means 60 for comparing the signals from the paired probe means 50 preferably consists of one comparison means for each set of paired probes. The signals indicative of the strength of the electrostatic field generated by the discharge electrode wires located between that set of paired probes 50, when compared to each other show whether the fields are in balance, and if not, how much imbalance exists. Means 60 may comprise any of the well known prior art means for comparing two voltage or current signals such as, but not limited to, a two channel oscilloscope upon which the two signals are displayed in a superimposed manner or a null meter wherein the two signals are compared and the imbalance, if any, therebetween indicated on the meter.

The probe means 50 may be any means capable of sensing the strength of an electrostatic field. However, in the preferred embodiment of the present invention, the probe means 50 comprises an induction coil 52 disposed with a tubular housing 54 as best seen in FIG. 3. The induction coil 52 is disposed at the outlet 56 of the tubular housing 54. The ends of the induction coil are interconnected with the comparison means 60. The probe 50 is mounted in the collecting electrode plate 22 such that the induction coil 52 is laterally opposite and facing the discharge electrode wire 36 which is being monitored.

In operation, the pulsation of the direct current input to the discharge electrode wires 36 results in the generation of an induced voltage in the induction coil 52. The induction coil 52 would be tuned to the proper frequency of pulsation and calibrated to yield a specific induction voltage at the design voltage applied to the discharge electrode assembly and at the proper spacing between discharge electrode and collecting electrode. Therefore, balanced signals from the paired probes 50 would mean optimum alignment of the collecting electrodes and discharge electrodes. Even if the induced voltage sensed by the paired probes is not equal to the design value, proper alignment would still be present when the two signals are balanced at the lower induction voltage.

The signals from the paired probes 50 monitoring the upper portion of the discharge electrode wires 36a, 36b, 36c and 36d would be transmitted through conduits 70 to comparison means 61, 63, 65 and 67 respectively. Similarly, the signals from the paired probes 50 monitoring the lower portion of the discharge electrode wires 36a, 36b, 36c and 36d would be transmitted through conduits 70 to comparison means 62, 64, 66 and 68 respectively.

Each of the comparison means 61 through 68 would give an indication of the imbalance, if any, of the electrostatic field strengths sensed by their respective set of paired probes. By adjusting the length of one or more of the four link rods 38 which suspend the box-like discharge electrode frame 30 from the four support insulators 40, the operator can reposition the discharge electrode frame 30 until zero or at least a minimal level of imbalance is indicated by the eight comparison means, thereby ensuring optimal alignment of the discharge and collecting electrodes.

I claim:
1. An electrostatic precipitator comprising:
   a. a casing for conveying a horizontal flow of gas to be cleaned;
   b. a discharge electrode suspended within the casing in a vertical plane parallel to the gas flow direction therethrough and to which a voltage is applied to generate an electrostatic field on each side thereof;
   c. first and second collecting electrode plates disposed within the casing in spaced vertical planes parallel to the gas flow direction therethrough and positioned substantially equally distance from said discharge electrode on opposite sides thereof;
   d. paired probe means comprising first and second probe means aligned oppositely each other on opposite sides of said discharge electrode, said first probe means mounted to said first collecting electrode plate and arranged to face said discharge electrode for sensing the strength of the electrostatic field generated by said discharge electrode and incident upon said first collecting electrode plate and second probe means mounted to said second collecting electrode plate and arranged to face said discharge electrode for sensing the strength of the electrostatic field generated by said discharge electrode and incident upon said second collecting electrode plate; and
   e. means operatively positioned and arranged with respect to said paired probe means for comparing the electrostatic field strengths sensed by said first and second probe means and for providing an indication of the degree of imbalance between said sensed electrostatic field strengths.

2. An electrostatic precipitator as recited in claim 1 wherein said first and second probe means each comprises:
   a. a tubular housing mounted to said respective collecting electrode plate and having an outlet facing said discharge electrode;
   b. an induction coil disposed within said tubular housing at the outlet thereof, said induction coil being tuned to receive the frequency of pulsation of the voltage applied to said discharge electrode so as to generate a signal indicative of the strength of the electrostatic field; and
   c. conduit means for transmitting said signal to said comparison means.

3. An electrostatic precipitator as recited in claim 2 wherein said comparison means is an oscilloscope.

4. An electrostatic precipitator as recited in claim 2 wherein said comparison means is a null meter.

* * * * *